(12) United States Patent
Fessler et al.

(10) Patent No.: US 7,016,198 B2
(45) Date of Patent: Mar. 21, 2006

(54) PRINTED CIRCUIT BOARD HAVING OUTER POWER PLANES

(75) Inventors: John Thomas Fessler, Lexington, KY (US); Keith Bryan Hardin, Lexington, KY (US); Eric Wayne Westerfield, Versailles, KY (US)

(73) Assignee: Lexmark International, Inc., Lexington, KY (US)

( * ) Notice: Subject to any disclaimer, the term of this patent is extended or adjusted under 35 U.S.C. 154(b) by 387 days.

(21) Appl. No.: 10/408,951

(22) Filed: Apr. 8, 2003

(65) Prior Publication Data

US 2004/0201971 A1  Oct. 14, 2004

(51) Int. Cl.
H05K 7/06  (2006.01)
H05K 9/00  (2006.01)

(52) U.S. Cl. ............ 361/780; 174/255; 174/262; 333/12

(58) Field of Classification Search ............ 361/780, 361/794; 257/691; 174/255, 262
See application file for complete search history.

(56) References Cited

U.S. PATENT DOCUMENTS

| | | | |
|---|---|---|---|
| 5,165,055 A | 11/1992 | Metsler | |
| 5,315,069 A | 5/1994 | Gebara | |
| 5,592,391 A | 1/1997 | Muyshondt et al. | |
| 5,708,400 A | 1/1998 | Morris | |
| 5,764,491 A | 6/1998 | Tran | |
| 6,104,258 A | 8/2000 | Novak | |
| 6,150,895 A | 11/2000 | Steigerwald et al. | |
| 6,178,311 B1 | 1/2001 | Pance et al. | |
| 6,198,362 B1 | 3/2001 | Harada et al. | |
| 6,246,301 B1 | 6/2001 | Sogo et al. | |
| 6,288,906 B1 | 9/2001 | Sprietsma et al. | |
| 6,329,604 B1 | 12/2001 | Koya | |
| 6,335,495 B1 * | 1/2002 | Farquhar et al. | 174/262 |
| 6,388,205 B1 | 5/2002 | Chua | |
| 6,828,514 B1 * | 12/2004 | Chan et al. | 174/262 |
| 2004/0040744 A1 * | 3/2004 | Wyrzykowska et al. | 174/262 |

* cited by examiner

Primary Examiner—John B. Vigushin
(74) Attorney, Agent, or Firm—Coats & Bennett, PLLC

(57) ABSTRACT

A multi-layer printed circuit board (PCB) routes signal traces on internal signal layer(s) and includes power planes on the two outermost layers. The outer layers are maintained at the same non-ground voltage level, and are electrically connected by a series of vias that circumscribe signal traces on the internal layer(s). With a preferred maximum spacing of one-tenth the wavelength of electromagnetic energy generated by the signal traces, the vias, together with the outer power planes, contain electromagnetic energy within the PCB. One or more of the outer planes may include a second power plane area maintained at a different voltage. The two power plane areas are connected by decoupling capacitors, located proximate underlying signal traces that traverse the two power plane areas.

31 Claims, 1 Drawing Sheet

PRINTED CIRCUIT BOARD HAVING OUTER POWER PLANES

BACKGROUND OF THE INVENTION

The present invention relates generally to the field of electronics and in particular to a printed circuit board having power planes on the outermost layers.

The use of multi-layer printed circuit boards (PCB) is well known in the electronic arts. As circuit components simultaneously shrink in size, increase in complexity, and operate at higher frequencies, the resulting increased density, complexity and issues of electromagnetic compatibility have driven the need for printed circuit boards to provide an increasing number of layers with which to route electrical signals and power supply voltages to all components. A multi-layer PCB provides a plurality of electrically conductive layers separated by insulating dielectric layers. The conductive layers may comprise contiguous plane areas, or alternatively may comprise a complex pattern of point-to-point signal traces. The signal traces are arranged to provide the connectivity required among all of the components on the PCB, employing well known routing strategies, such as for example, primarily north-south traces on one layer, and primarily east-west traces on another layer. Both signal traces and power plane voltages may be propagated to other layers by vias, electrically conductive holes through one or more dielectric layers and possibly one or more conductive layers. Signal traces and power plane areas are routed away from vias passing through conductive layers that are not to be electrically connected at that level, as is well known in the art.

A typical "stack," or arrangement of layers, for early multi-layer PCBs was to locate ground and/or power planes on internal conductive layers, and route signal traces on the outer PCB layers. This facilitated the interconnection of components with signal traces, requiring a minimum number of vias. As PCBs were populated with more complex components, such as microprocessors and Application Specific Integrated Circuits (ASIC), which often require multiple power supply voltage levels, additional internal power plane layers were added to the PCB stack.

With increasing operating frequency of many electrical circuits, the Electromagnetic Compatibility (EMC) of the PCB became a concern, as signal traces radiate electromagnetic energy at high frequencies, potentially causing interference with other electronic circuits. It was discovered that the use of contiguous power planes covering a significant area often improved signal quality and EMC performance. This is due to several factors, including the overall reduction of the loop area between the signal traces and their return signal paths, and the inherent decoupling provided by the distributed inter-plane capacitance. For example, a common stack for a 6-conductive-layer PCB is Signal-Power-Signal-Signal-Ground-Signal (often referred to as S-P-S-S-G-S). In this stack, the high-speed signals are routed on the two middle, or innermost, signal layers, between the power and ground plane layers. In this configuration, provided that the power plane is well decoupled to the ground plane, the power and ground planes together attenuate the electromagnetic fields radiated by those traces on the internal layers shielded by the power planes.

In circuits where most or all of the signal traces carry high frequency signals, it is known to "bury" all signal traces on internal conductive layers, and locate dedicated ground planes on the outer two PCB layers. Both the top and bottom conductive planes are formed in as large and contiguous an area as possible, both are connected to the ground reference voltage of the power supply, and the outer planes are interconnected to each other vertically through the use of vias generously located throughout the plane area. Positive power supply voltage levels may be distributed to components on one or more internal power plane layers, or alternatively as signal traces on one or more signal trace layers. On the outer layers, short traces from each component pin route the associated signal from each pin to a via, which connects to a signal trace located on an interior layer. To allow this routing, the area immediately adjacent the pins at each component position is clear of the ground plane, which fills the remainder of the outer layer with a contiguous ground plane. This PCB stack has been known to reduce electromagnetic emissions from the PCB by as much as 10 dB.

Although the use of outer ground planes provides a significant improvement in EMC performance of a PCB, there remain some situations where this implementation is not feasible or desirable. One example is the use of a component wherein the housing or a portion of the housing is maintained during operation at a voltage level other than ground, such as for example the collimator of a laser diode, or the tab of a TO-220 semiconductor package. In such cases, providing a ground plane on the outer layer would require that a large area of the ground plane be excluded from the vicinity of the relevant component. Signal traces routed to this component would no longer have the ground plane in close proximity, resulting in greater emissions. Alternatively, if the outer ground plane were placed closer to the part to reduce emissions, there is an increased risk of a short circuit between the component housing and ground.

It is desirable, therefore, to provide positive or negative voltage level power planes—rather than a ground plane—as the outermost layers in a multi-layer PCB stack. U.S. Pat. No. 6,288,906 discloses a printed circuit board having power plane layers at the outermost layer positions. The outer power planes of the '906 patent, however, are connected to different positive supply voltages. As described above, it is known that generously interconnecting the two outer ground plane layers by vias increases the EMC performance of the PCB. The direct connection of outer power planes by vias is impossible when the planes are maintained at different voltages.

SUMMARY OF THE INVENTION

The present invention relates to a multi-layer printed circuit board having power planes on the outermost layers. Conductive planes on the outer layers are maintained at the same voltage. The power planes are electrically connected by a series of vias circumscribing at least some of the signal traces on internal signal layers. By placing the vias with a maximum spacing of one-tenth the wavelength of the highest frequency of electromagnetic energy generated by the signal traces, radiation of the electromagnetic energy is reduced.

One of the outer power planes may include a conductive plane portion maintained at a different voltage, such as signal ground. The two conductive planes are connected by decoupling capacitors. The decoupling capacitors are preferably located proximate signal traces crossing the two conductive plane areas.

DETAILED DESCRIPTION OF THE INVENTION

Figure 1:
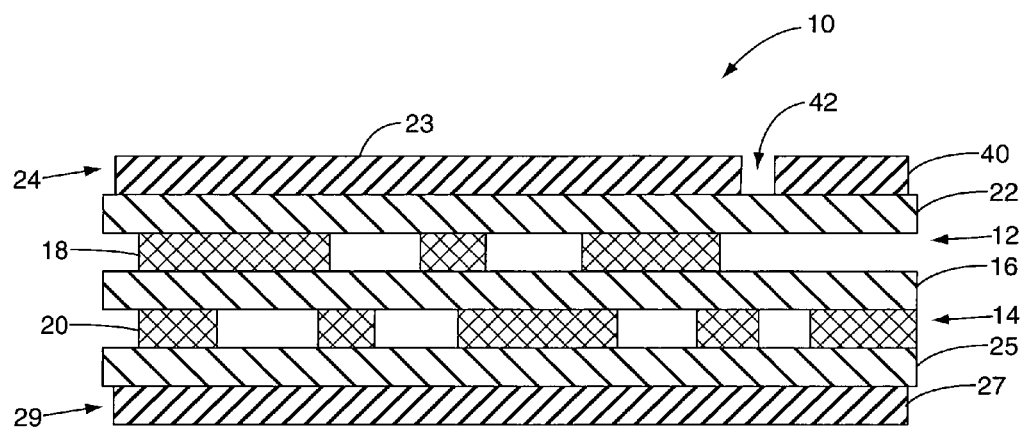
FIG. 1 is a section view of a printed circuit board.

The present invention relates to a multi-layer Printed Circuit Board (PCB) having non-ground voltage level power planes at the outermost layers. The outer power planes are maintained at the same voltage level, which may be a positive or negative voltage level with respect to the reference voltage, or signal ground, of the circuit. For simplicity and clarity of expression, the invention is described herein with positive voltage level outer power planes. A multi-layer PCB according to the present invention is depicted in FIG. 1, indicated generally by the numeral 10. The PCB 10 includes an internal, conductive signal layer 12, comprising a plurality of signal traces 18. The signal traces 18 may be formed by lithography, etching, printing, plating, or other methods as known in the art. The PCB may include only the single signal trace layer 12, or alternatively, as depicted in FIG. 1, may additionally include a second signal layer 14, comprising signal traces 20. The PCB 10 may, in general, comprise any number of internal signal layers 12, 14, although only two such layers are depicted in FIG. 1 for simplicity. The signal traces 18, 20 in the signal layers 12, 14 may be oriented orthogonally, as well known in the art. The signal layers 12, 14 are separated by an insulating dielectric layer 16. Signal traces 18, 20 may be connected where necessary or desired by vias (not shown) through dielectric layer 16.

Overlying the uppermost signal layer 12 is another dielectric layer 22, and overlying the dielectric layer 22 is a positive voltage level power plane layer 24. Positive voltage level power plane layer 24 comprises a positive voltage level power plane 23 and a ground voltage level power plane 40, separated by a gap 42. The purpose and function of the ground voltage level power plane 40 is explained below.

Similarly, underlying the lowermost signal layer 14 is another dielectric layer 25. Underlying dielectric layer 25 is a positive voltage level power plane layer 29, comprising positive voltage level power plane 27. Although not depicted in FIG. 1, the positive voltage level power plane layer 29 may additionally include one or more power or ground voltage level power plane areas.

According to the present invention, positive voltage level power planes 23 and 27 are maintained at the same positive power supply voltage level whenever power is applied to the PCB 10. Electronic components, preferably surface-mount components, may be mounted on positive voltage level power plane layer 24, 29, or both. The PCB 10 of the present invention finds particular utility in applications wherein components to be mounted to layers 24 and/or 29 include a housing with a significant surface area that is at a positive voltage level when the component is in operation. One example of such a component is the collimator of an anode stem laser diode commonly utilized in laser printers, copiers, fax machines, and the like. The collimator housing is maintained at the laser diode's $V_{cc}$ voltage level, which is typically +5V DC. As another example, a variety of semiconductor devices are packaged in the industry standard TO-220 package, which includes a tab maintained at a positive voltage level in operation.

Figure 2:
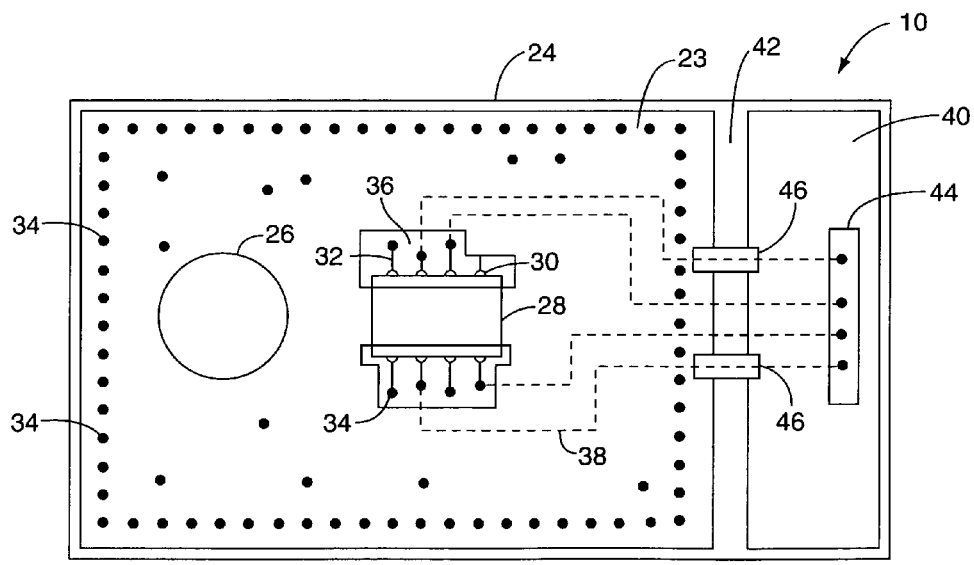
FIG. 2 is a plan view of a printed circuit board.

FIG. 2 depicts a plan view of a PCB 10 according to the present invention, with positive voltage level power plane layer 24 as the uppermost layer. Two components, 26 and 28, are mounted on the positive voltage level power plane 23. Component 26 represents a laser diode collimator, as discussed above. The collimator 26 is mounted directly to the positive voltage level power plane 23, forming electrical connectivity therewith (other connections to collimator 26 not shown). Component 28 is a representative integrated circuit, which may comprise any of a broad variety of electronic components. The positive power supply voltage input pin 30 of component 28 is connected by a short signal trace directly to the positive voltage level power plane 23. Other I/O pins of the component 28 are connected by short signal traces 32 to vias 34, which connect to signal traces 18, 20 on internal signal trace layers 12, 14 (or alternatively, connect to other internal power plane or ground plane layers). A "keep-out" region 36 is formed on either side of the component 28 position, to provide space for the short signal traces 32 and vias 34 necessary to route signals to the component 28. Note that the central region of component 28, i.e., the surface below the component 28 when it is mounted on the PCB 10, is filled with contiguous positive voltage level power plane 23. This maximizes the surface area of the positive voltage level power plane 23, and hence maximizes its effectiveness in suppressing electromagnetic emissions.

The placement of positive voltage level power planes 24, 29 at the outermost layers of a printed circuit board 10 improves EMC performance of the PCB 10 by suppressing the emission of electromagnetic energy from the upper and lower surface. According to the present invention, additional suppression and shielding of electromagnetic energy from the edges of PBC 10 is obtained through the use of vias 34 connecting both positive voltage level power planes 23, 27, and circumscribing at least high-frequency signal traces 18, 20. As depicted in FIG. 2, a "fence" of vias 34 extends around the periphery of the positive voltage level power plane 23, thus shielding all signal traces 18, 20 routed on internal signal trace layers 12, 14 within the fenced-in region. While this configuration is generally preferred for maximum electromagnetic shielding, the via 34 fence need not be provided at the periphery of the positive voltage level power plane 23. Alternatively, a via 34 fence may be constructed around only that portion of the PCB 10 containing high-frequency signal traces 18, 20. Additional vias 34, generously located throughout the area of positive voltage level power plane 23, ensure uniformity of voltage levels between power planes 23 and 27, thus enhancing electromagnetic shielding.

In order to provide sufficient attenuation, the spacing of the vias 34 must be controlled. As is well known in the art, the larger the gap between the conductors shielding electromagnetic energy, the more efficient a radiator is created. For sufficient attenuation, the gap between vias 34 is preferably no greater than one-half of a wavelength of the electromagnetic energy within the dielectric of PCB 10, at the maximum frequency of signal traces 18, 20. More preferably, the maximum gap between vias 34 is no greater than one-tenth of a wavelength. In calculating the wavelength, the effects of the material forming dielectric layers 22, 25 must be considered. The wavelength (in meters) of an electromagnetic wave in a homogeneous, non-magnetic medium is given by:

$$\lambda = \frac{1/\sqrt{\mu_0 \varepsilon_0 \varepsilon_r}}{f} \approx \frac{300}{\sqrt{\varepsilon_r} f}$$

Where $\lambda$ is the wavelength in meters, $\varepsilon_r$ is the relative dielectric constant of the PCB 10 dielectric and f is the frequency in MHz. Assuming a maximum spacing of one-tenth wavelength, the vias 34 comprising the fence should have a spacing l (in mills) no greater than $$l = \frac{1.1811 \times 10^3}{\sqrt{\varepsilon_r} f}$$

In many applications, it is necessary or desirable to connect one PCB 10 to another, or to other electrical devices, through cables. This is typically accomplished by providing a cable connector on the PCB 10, such as the connector 44 depicted in FIG. 2. One or more pins of the connector 44 are typically dedicated to ground and used to terminate the conductors tied to ground on both PCBs 10. In many cases, one of these connector 44 ground pins is also used to terminate the shield of the cable used to interconnect the PCBs 10. In this case, it is desirable to maintain a section of the uppermost layer at the signal ground voltage level, to minimize the risk of a short circuit between the cable shield and the connector 44 or the PCB 10. FIG. 2 depicts a ground voltage level power plane 40 formed on the uppermost surface of the PCB 10 (i.e., as part of the positive voltage level power plane layer 24), adjacent to but separate from the positive voltage level power plane 23, forming a gap 42 therebetween. The width of the gap 42 is sufficient to minimize the risk of a short circuit, given production tolerances and similar considerations. Note that while the power plane area 40 is presented by way of example as being maintained at a ground voltage level, the present invention is not so limited. In general, the power plane area 40 may be maintained at any voltage level distinct from the positive voltage level power plane 23, as necessary or desired.

Whenever multiple power planes 23, 40 are co-located on the outer surface of PCB 10, it is important that the different planes 23, 40 be interconnected using a sufficient number of decoupling capacitors 46, to avoid voltage spikes, ringing, and the like on signal traces 18, 20. According to the present invention, these decoupling capacitors 46, spanning the gap 42, are located proximate signal traces 38 crossing the gap 42. The placement of decoupling capacitors 46 adjacent such signal traces 38 allow high-frequency currents flowing in the power plane areas 23, 40 to return immediately adjacent to the signals 38.

In another embodiment of the present invention, with particular utility in the case where currents in components 26 or 28 are sufficient to cause EMC problems, additional shielding is achieved by positioning a conductive shield (not shown) over the component 26, 28, and electrically connecting the shield to the positive voltage level power plane 23. The connection may be made using surface mount, pin-through-hole, gasketing techniques, or the like, as known in the art. Preferably, the spacing of the connections between the shield and the positive voltage level power plane 23 is the same as or less than the spacing between "fence" vias 34, as discussed above.

As used herein, the terms "upper," "lower," "over," "under," and the like, and derivations thereof, are used for convenience to distinguish one side of the PCB 10 of the present invention from the other, with reference to the orientations depicted in FIGS. 1 and 2. In general, which side of the PCB 10 of the present invention is considered the "top" or "bottom" in any given implementation is irrelevant.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A multi-layer printed circuit board, comprising:
a first signal layer comprising a plurality of signal traces;
a first dielectric layer overlying said first signal layer;
a first power plane layer substantially overlying said first dielectric layer,
comprising a first conductive plane maintained at a non-ground voltage level;
a second dielectric layer underlying said first signal layer; and
a second power plane layer substantially underlying said second dielectric layer,
comprising a conductive plane maintained at the same voltage level as said first power plane layer;
wherein said first and second power planes layers are the outermost layers of said printed circuit board.

2. The printed circuit board of claim 1 further comprising a second signal layer comprising a plurality of signal traces, disposed between said first and second dielectric layers.

3. The printed circuit board of claim 1 further comprising a ground plane layer disposed between said first and second dielectric layers, said ground plane layer comprising a conductive plane maintained at ground voltage level.

4. The printed circuit board of claim 1 further comprising a third power plane layer disposed between said first and second dielectric layers, said third power plane layer comprising a conductive plane maintained at a non-ground voltage level.

5. The printed circuit board of claim 1 further comprising at least one component mounted on said first power plane layer, said component having a power input electrically connected to said first conductive plane.

6. The printed circuit board of claim 5 wherein said first conductive plane extends at least partially beneath the housing of said component.

7. The printed circuit board of claim 5 wherein a conductive shield encloses said component and is electrically connected to said first conductive plane.

8. The printed circuit board of claim 5 wherein the housing of said component comprises an electrical connection, and wherein said housing is in contact with said first conductive plane.

9. The printed circuit board of claim 8 wherein said component is the collimator of a laser diode.

10. The printed circuit board of claim 1 further comprising a plurality of vias electrically connecting said first power plane layer and said second power plane layer, said vias disposed to circumscribe at least one signal trace on said first signal layer.

11. The printed circuit board of claim 10 wherein said vias are spaced apart at no greater than one-half of the wavelength of electromagnetic energy radiated by said at least one signal trace at the maximum frequency thereof.

12. The printed circuit board of claim 11 wherein said vias are spaced apart at no greater than one-tenth of the wavelength of electromagnetic energy radiated by said at least one signal trace at the maximum frequency thereof.

13. The printed circuit board of claim 10 wherein the maximum spacing of said vias is given by:

$$l = \frac{1.1811 \times 10^3}{\sqrt{\varepsilon_r} f}$$

where $\varepsilon_r$ is the relative dielectric constant of said printed circuit board dielectric, f is the maximum frequency of signals on said at least one signal trace in MHz, and l is the spacing of said vias in mills.

14. The printed circuit board of claim 1 wherein said first power plane layer additionally comprises a second conductive plane, separate from said first conductive plane and forming a gap therebetween, said second conductive plane maintained at a voltage level different from said first conductive plane.

15. The printed circuit board of claim 14 wherein said first and second conducive planes are connected by at least one decoupling capacitor.

16. The printed circuit board of claim 15 wherein said at least one decoupling capacitor is located proximate a signal trace crossing said gap between said first and second conducive planes.

17. A method of reducing electromagnetic emissions from a multi-layer printed circuit board, comprising:
routing signal traces on one or more internal signal layers;
providing first conductive planes on both outer layers and maintaining said first conductive planes at the same non-ground voltage level; and
connecting said first conductive planes with a series of vias disposed around said signal traces.

18. The method of claim 17 further comprising mounting at least one component on at least one said outer layer, wherein said first conductive plane extends at least partially beneath a housing of said component.

19. The method of claim 18 further comprising shielding said component by enclosure within a conductive shield electrically connected to said first conductive plane.

20. The method of claim 18 further comprising forming an electrical connection between said housing and said first conducive plane.

21. The method of claim 17 wherein said vies circumscribe high-frequency signal traces.

22. The method of claim 17 wherein said vias are disposed around the periphery of said printed circuit board.

23. The method of claim 17 wherein said vias are disposed with a maximum spacing of one-half of the wavelength of electromagnetic energy radiated by said signal traces at the maximum frequency thereof.

24. The method of claim 17 wherein said vias are disposed with a maximum spacing of one-tenth of the wavelength of electromagnetic energy radiated by said signal traces at the maximum frequency thereof.

25. The method of claim 17 wherein said vias are disposed with a maximum spacing given by:

$$l = \frac{1.1811 \times 10^3}{\sqrt{\varepsilon_r} f}$$

where $\varepsilon_r$ is the relative dielectric constant of said printed circuit board dielectric, f is the maximum frequency of signals on said signal traces in MHz, and l is the spacing of said vias in mills.

26. The method of claim 17 further comprising:
providing a second conductive plane on at least one said outer layer; and
connecting said first and second conductive planes with decoupling capacitors.

27. The method of claim 26 further comprising locating said decoupling capacitors proximate signal traces crossing the regions underlying said first and second conductive planes.

28. A multi-layer printed circuit board, comprising:
at least one internal signal layer having signal traces formed thereon;
power plane layers disposed at the outermost layer positions of said printed circuit board, each said power plane layer comprising a first conductive plane, both said first conductive planes maintained at the same non-ground voltage level; and
a plurality of vias electrically connecting said conductive planes, said vias disposed around at least a portion of said signal traces.

29. The printed circuit board of claim 28 wherein at least one said power plane layer additionally comprises a second conductive plane maintained at a different voltage level than said first conductive plane.

30. The printed circuit board of claim 29 further comprising decoupling capacitors connected between said first and second conductive planes, said capacitors disposed proximate signal traces crossing the regions underlying said first and second conductive planes.

31. The printed circuit board of claim 28 wherein said vias are disposed around said traces with a maximum spacing of one tenth of a wavelength at the highest frequency of electromagnetic energy generated in said at least one internal signal trace layer.

* * * * *